United States Patent [19]

Ogura et al.

[11] Patent Number: 4,533,410
[45] Date of Patent: Aug. 6, 1985

[54] PROCESS OF VAPOR PHASE EPITAXY OF COMPOUND SEMICONDUCTORS

[75] Inventors: Mototsugu Ogura, Nara; Yuzaburoh Ban, Osaka; Nobuyasu Hase, Hyogo, all of Japan

[73] Assignee: Matsushita Electric Industrial Co., Ltd., Osaka, Japan

[21] Appl. No.: 542,770

[22] Filed: Oct. 17, 1983

[30] Foreign Application Priority Data

Oct. 19, 1982 [JP] Japan .................................. 57-183945

[51] Int. Cl.³ .................... H01L 21/205; H01L 21/365
[52] U.S. Cl. .................................. 148/175; 29/576 E; 148/174; 148/DIG. 56; 148/DIG. 110; 156/612; 156/614; 156/DIG. 70; 427/87; 118/720; 118/725; 118/730
[58] Field of Search ............................... 148/174, 175; 156/612-614, DIG. 70; 29/576 E; 427/87; 118/720, 725, 730

[56] References Cited

U.S. PATENT DOCUMENTS

| | | | |
|---|---|---|---|
| 3,441,000 | 4/1969 | Burd et al. | 148/175 X |
| 3,492,175 | 1/1970 | Conrad et al. | 148/175 |
| 3,635,771 | 1/1972 | Shaw | 148/174 |
| 3,925,119 | 12/1975 | Philbrick et al. | 156/613 X |
| 4,007,074 | 2/1977 | Ogirima et al. | 148/175 |
| 4,116,733 | 9/1978 | Olsen et al. | 148/175 |
| 4,220,488 | 9/1980 | Duchemin et al. | 148/174 |
| 4,404,265 | 9/1983 | Manasevit | 156/612 X |

OTHER PUBLICATIONS

Seki et al., "New Vapor Growth Method for GaP . . . ", Japan. J. Appl. Phys., vol. 12, (1973), No. 7, pp. 1112-1113.

Primary Examiner—William G. Saba
Attorney, Agent, or Firm—Burgess, Ryan & Wayne

[57] ABSTRACT

A layer of a compound semiconductor having good quality is formed by disposing a substrate in an epitaxial growth layer, feeding a second reactant gas through a guide member extending from the downstream side to the upstream side of the flow of a first reactant gas, mixing the first reactant gas and second reactant gas, and supplying the resultant gaseous mixture of the first and second reactant gases onto the substrate.

22 Claims, 11 Drawing Figures

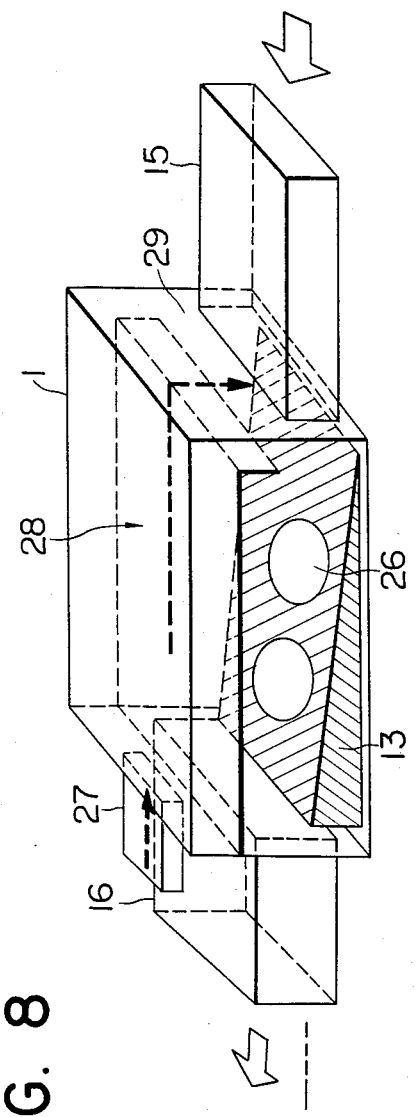
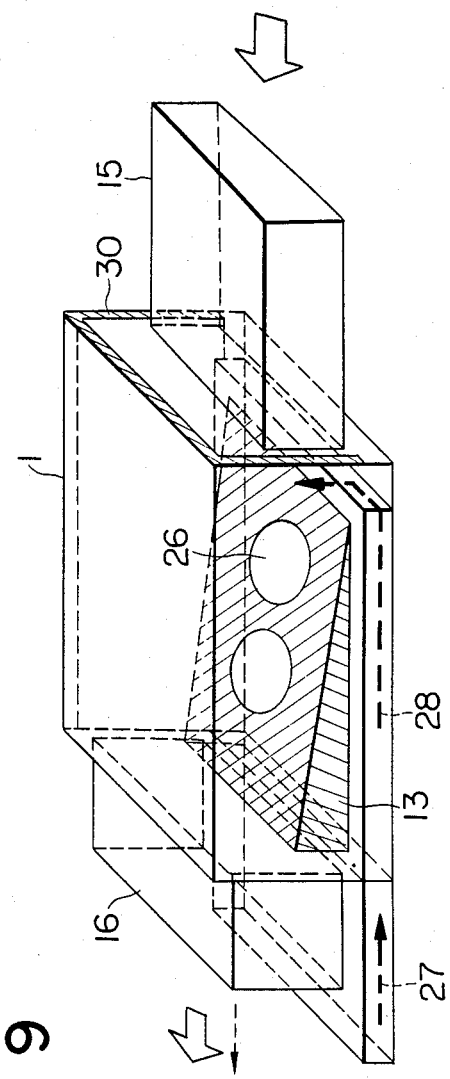
FIG. 8
FIG. 9

PROCESS OF VAPOR PHASE EPITAXY OF COMPOUND SEMICONDUCTORS

BACKGROUND OF THE INVENTION (1) Field of the Invention

This invention relates to a process of vapor phase epitaxy, which process is able to provide a good grown layer of a compound semiconductor.

(2) Description of the Prior Art

As processes for epitaxially growing compound semiconductors of Groups III–V metals, there are the liquid phase epitaxy and vapor phase epitaxy. The latter epitaxy is suited for mass production. Among various vapor phase epitaxial growth processes, the MOCVD process (Metal-Organic-CVD process) is especially useful as it permits to control the vapor phase and solid phase substantially at the same proportions and features superior controllability to the halide process.

A conventional MOCVD process is illustrated in FIG. 1, in which end caps 2,3 are provided respectively at both ends of a reactor tube 1 and gas-feeding tubes 4,5 are provided through the end cap 2. When growing InP films, for example, a metal alkyl which serves a source for In such as TEI (triethylindium) and $PH_3$ gas which yields P are supplied into the reactor tube 1, independently through their corresponding gas-feeding tubes 4,5.

The gas, which has flown out of the reactor tube 1, is then exhausted through an outlet 6. A susceptor 8, which lies on a boat 7, is made of SiC-coated graphite. On the susceptor 8, an InP substrate 9 is mounted. The substrate 9 is heated inductively using an rf-coil 10. The temperature of the substrate 9 is detected by a thermocouple 11, by which the rf-coil 10 is usually feed-back controlled so as to control the temperature of the substrate 9 at a constant level. When carrying out for example an epitaxial growth of InP on the InP substrate 9 in the above apparatus, the growth rate is governed generally by the amounts of source gases containing Group-III elements. Where no external heater 12 is provided with the chamber 1 in the apparatus of FIG. 1, the growth rate remains very slow even if the flow rate of TEI which is a source material for In, the flow rate of $PH_3$ and the growth temperature are varied. When, for example, TEI is placed in a constant-temperature tank of 650° C. and is bubbled with 100 cc/min. of $H_2$ and 200 cc/min. of an $H_2$-base gas containing 2% of $PH_3$ is fed together with 1 l/min. of an $H_2$ carrier gas and the epitaxial growth process is carried out for 90 minutes at a growth temperature of 650° C., an epitaxial layer of InP is formed on the substrate 9 to a thickness of about 0.1 μm. Accordingly, it is impractical to use the apparatus of FIG. 1 as the growth rate is too slow (Where the heater 12 is not provided).

This slow growth rate can be attributed to the fact that the thermal decomposition of $PH_3$ does not proceed well and $PH_3$ is not decomposed and undergoes reactions with TEI in the course of its flow toward the substrate 9 to form complexes such as $(C_2H_5)3.PH_3$ and the like, whereby impairing the growth of InP. In the apparatus of FIG. 1, there is another inconvenience that these complexes deposit on the inner walls of the reactor tube 1 and cap 2.

With a view toward solving the above inconvenience, it has also been proposed to provide a heater 12 on the gas-feeding tube 5 which is employed as the $PH_3$ gas line as illustrated in FIG. 1 so that $PH_3$ gas in pre- heated to 800° C. or so and the decomposition of $PH_3$ gas is thus promoted. This process is able to improve the growth rate to a certain extent but causes the growth of InP to occur on the end cap 2 and the reactor tube 1 besides the substrate 9. Therefore, the efficiency of growth of InP on the substrate 9 is lowered. Unless the heater 12 is disposed very close to the reactor tube 1, a great deal of P is allowed to deposit on the wall of the gas-feeding tube 5 between the heater 12 and reactor tube 1 and the efficiency is hence lowered further. If the heater 12 is incorporated, it is necessary to construct the portion of the gas-feeding tube 5, which portion is surrounded by the heater 12, with a siliceous material, thereby tending to make the apparatus complex. If P is caused to deposit in a large amount on the wall of the tube and the like, the operation of the apparatus is hampered. Thus, it is extremely inconvenient to allow P to deposit in a large amount on the inner walls of the apparatus.

SUMMARY OF THE INVENTION

An object of this invention is to provide a process which is simple but is able to form a layer of a high quality compound semiconductor at a relatively high velocity while minimizing deposition of undesired substances on the inner walls of an apparatus.

Another object of this invention is to save source gases by achieving an improvement to the efficiency of growth of a compound semiconductor layer.

A further object of this invention is to permit the use of substrates having large areas and to treat more substrates.

In one aspect of this invention, there is thus provided a process of vapor phase epitaxy for a compound semiconductor, which process comprises disposing a substrate in an epitaxial growth chamber, feeding a second reactant gas through a guide member extending from the downstream side to the upstream side of the flow of a first reactant gas, mixing the first reactant gas fed from the upstream side with the second reactant gas fed through the guide member, and supplying the resultant gaseous mixture of the first and second reactant gases onto the substrate so as to form the compound semiconductor in the form of a layer.

With the foregoing view, the present invention provides particularly a process of vapor phase epitaxy, in which $PH_3$ gas is pre-decomposed in a epitaxial growth chamber, the pre-decomposed $PH_3$ gas is mixed with gases such as TEI at a point upstream a substrate, and the resultant gaseous mixture is then supplied onto the substrate so that an epitaxially-grown layer of a good InP-base semiconductor or the like is formed effctively at a high velocity while minimizing deposition of undesired substances.

BRIEF DESCRIPTION OF THE DRAWINGS

FIGS. 8, 9 and 10 are schematic illustrations of vapor phase epitaxial growth apparatus according respectively to further embodiments of this invention.

DETAILED DESCRIPTION OF THE PREFERRED EMBODIMENTS

Figure 1:
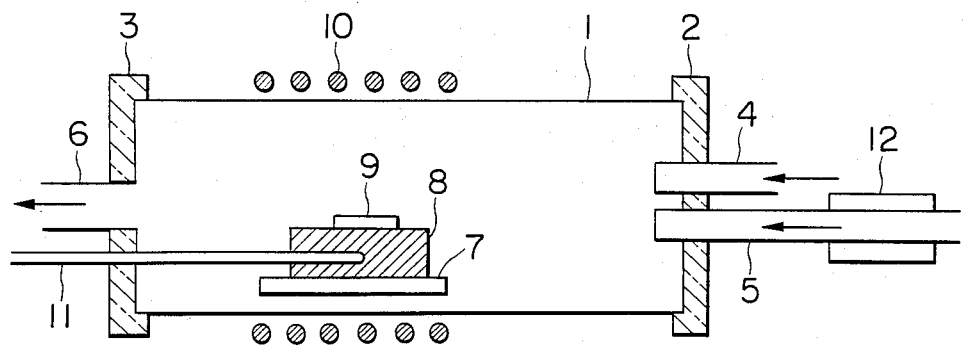
FIG. 1 is a schematic illustration of a conventional vapor phase epitaxial growth apparatus.
Figure 2:
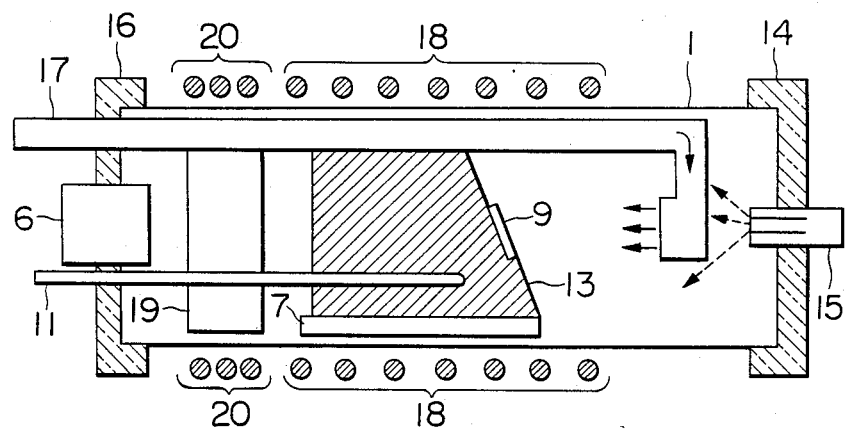
FIG. 2 is a schematic illustration of a vapor phase epitaxial growth apparatus according to one embodiment of this invention.

A growth apparatus useful in the practice of this invention is shown in FIG. 2, in which like reference numerals identify like elements of structure in FIG. 1. The feeding of gases into the reactor tube 1 is carried out in the following manner. Namely, a metal alkyl such as TEI is fed using a gas-feeding tube 15 through an end cap 14 which is located at the upstream side. On the other hand, a $PH_3$ gas is fed through an end cap 16 which is located at the downstream side and is then guided through a gas guide tube 17 to a point upstream the substrate 9. When forming a crystalline layer of InP, TEI and $PH_3$ are mixed in the above manner. When causing, for example, InGaAsP to grow, TEI, TEG and $AsH_3$ gases are fed from the upstream side, namely, through the tube 15. The tube 15 may be formed of three mutually-independent guide tubes as illustrated in FIG. 2. Alternatively, the tube 15 may be formed of a single tube. The three gases which have flown out of the gas-feeding tube 15 are mixed with the $PH_3$ gas introduced through the guide tube 17 at a point near the substrate 9. A Group-III metal alkyl undergoes a reaction with a gas of a Group-V element even at room temperature and the Group-III metal alkyl is susceptible of depositing on the inner wall of the feeding pipe, thereby making the ON-OFF control of the gas difficult. Accordingly, it is preferable to form the gas-feeding tube 15 into three independent lines whenever feasible, as illustrated in FIG. 2. Where an rf-coil 18 is provided over a region in which the substrate 9 and a carbon-made susceptor 13 are embraced, the $PH_3$ gas which has been introduced in a state heated to a high temperature through the guide tube 17 is heated by the heat of the susceptor 13 when it passes over the susceptor 13. This reduces the deposition of P on the inner wall of the tube 17 to an extremely low level because the guide tube 17 is heated within the reactor tube and the heating can be effected to the vicinity of the outlet of the tube 17 as described above.

The pre-decomposed $PH_3$ gas is fed to a point upstream the substrate 9, where it is mixed with TEI and the like to form a gaseous mixture. The gaseous mixture is then supplied onto the substrate 9, thereby forming InP, InGaAsP or the like. If one wants to raise the pre-decomposing temperature of the $Ph_3$ gas further, it is necessary to provide a heater block 19 at the downstream side of the susceptor 13 and to arrange an rf-coil 20 for heating the heater block 19.

Incidentally, the rf-coil 20 may be formed by using a part of the rf-coil 18 and making the winding interval of the part narrower. It is undesirous to provide the heater block 19 at the upstream side of the substrate 9 to subject the $Ph_3$ gas to pre-decomposition.

Figure 3:
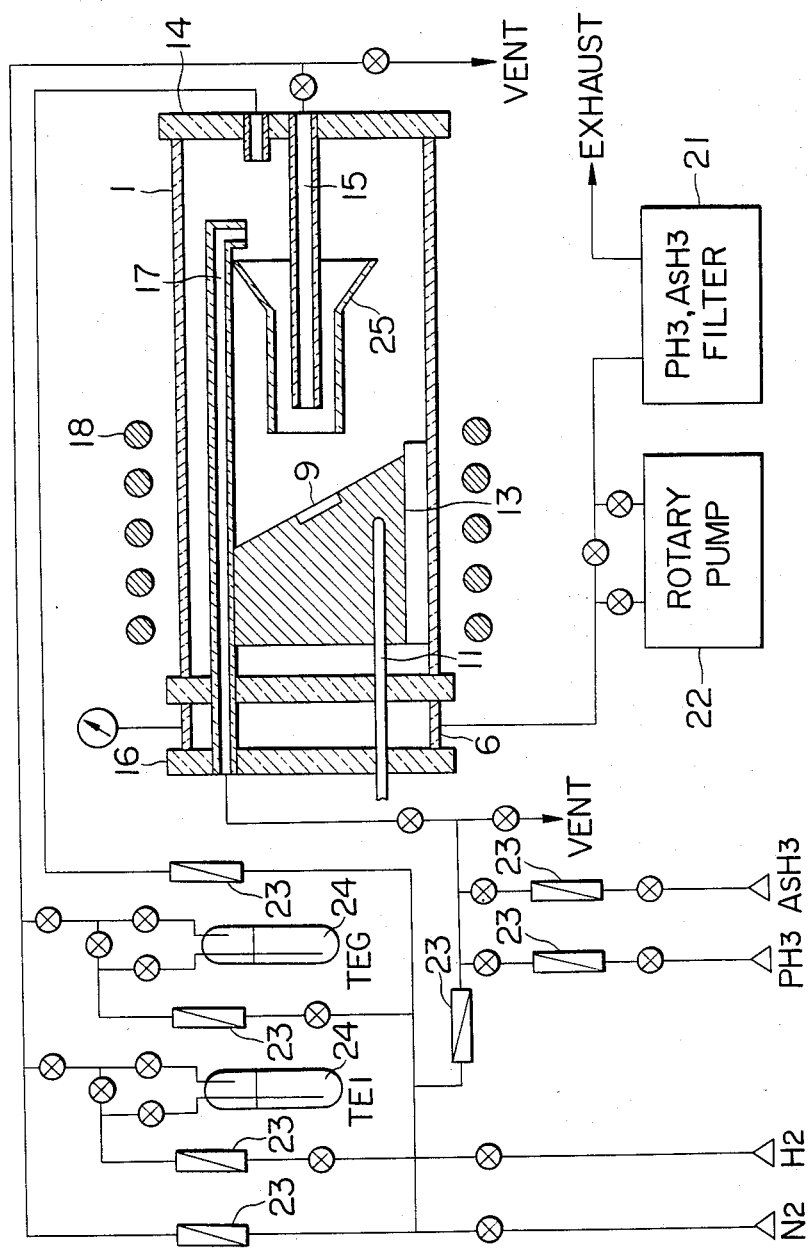
FIG. 3 is a schematic illustration of a vapor phase epitaxial growth apparatus according to another embodiment of this invention.

Next, a description will be made with reference to FIG. 3 on a process for effecting the mixing of reactant gases at a point closer to the substrate and improving the efficiency of growth. In the aparatus shown in FIG. 3, numeral 21 indicates a filter for $PH_3$ and $AsH_3$ which filter is used to treat the exhaust gas. Designated at numeral 22 is a rotary pump to keep the interior of the reactor tube 1 under reduced pressure. Numeral 23 are flow regulators and numeral 24 indicates gas cylinders. Designated at numeral 25 is a gas-introducing member which is formed of a quartz block and adapted to mix the gases. This gas-introducing member 25 is effective in improving the efficiency of the supply of the gaseous mixture to the substrate 9. By guiding the gas from the gas-feeding tube 15 into the gas-introducing member 25, it is possible to carry out the mixing of the gases at a point close to the substrate. In the apparatus of FIG. 3, gases other than $PH_3$ (for example, TEI from the gas-feeding tube 15) are heated by the heat of the susceptor 13 at a point immediately upstream the substrate 9 and a high degree of growth efficiency is thus obtained. The mixing state of the reactant gases is important for the uniformity of the thickness of an InP grown layer on the substrate 9. It is thus desirous to provide the gas-introducing member 25 at the upstream side of the substrate 9 for mixing the gases in view of such parameters as the flow rates of the reactant gases, illustrated in FIG. 3.

Typical growth conditions for InP crystals in the apparatus of FIG. 2 are given by way of example in Table 1.

TABLE 1

| Typical Growth Conditions for InP | |
|---|---|
| Growth temperature: | 650° C. |
| Flow rates: | |
| $H_2$ into TEI (45° C.) | 150 cc/min. |
| $PH_3$ | 4 cc/min. |
| Total flow | 12 l/min. |

Under the above growth conditions, a good epitaxial InP layer of $8 \times 12$ mm wide was obtained at a growth rate of about 3 μm/hr, almost evenly over the eitire area of the substrate. The grown layer was so good that the carrier concentration and mobility of the undoped epitaxial InP layer were $1 \times 10^{-6}$ $cm^{-3}$ and 3500 $cm^2$/V.sec. respectively. A slight deposition of P was observed on the inner wall of a tip portion of the tube 17, which tip portion was located near the gas outlet thereof, but practically no deposition of P was observed at other parts.

As apparent from the above experiment, it is possible to form a good epitaxial InP layer at a high velocity and with a high degree of efficiency by pre-decomposing $PH_3$, which has poor thermal decomposability, efficiently in an epitaxial growth chamber and mixing it with TEI which has been fed from the upstream side. The above vapor phase epitaxy requires an apparatus having a relatively simple structure and enjoys a lower reaction loss. Moreover, the deposition of P is reduced and the gas-feeding tubes 15, 17 and gas-introducing member 25 are detachable in the apparatus depicted in FIG. 2 or 3, thereby facilitating the cleaning of the interior of the reactor tube 1.

In addition, the tube 17 may be constructed in such a way that it is detachable near its gas outlet. The tube 17 may extend through the susceptor 13, may be disposed in contact with the susceptor 13 or may be provided in the vicinity of the susceptor 13. The tube 17 may also extend through the heater block 19, may be disposed in contact with the heater block 19, or may be provided in the vicinity of the heater block 19.

Using the apparatus of FIG. 3, InGaAs crystals and InGaAsP crystals were independently caused to grow on the InP substrate 9.

Growth conditions for InGaAs are given in Table 2.

TABLE 2

| Typical Growth Conditions for InGaAs | |
|---|---|
| Growth temperature | 500° C. |
| Flow rates: | |
| H₂ into TEI (45° C.) | 80 cc/min. |
| H₂ into TEG (0° C.) | 10 cc/min. |
| AsH₃ | 4 cc/min. |
| Total flow | 12 l/min. |

Figure 4:
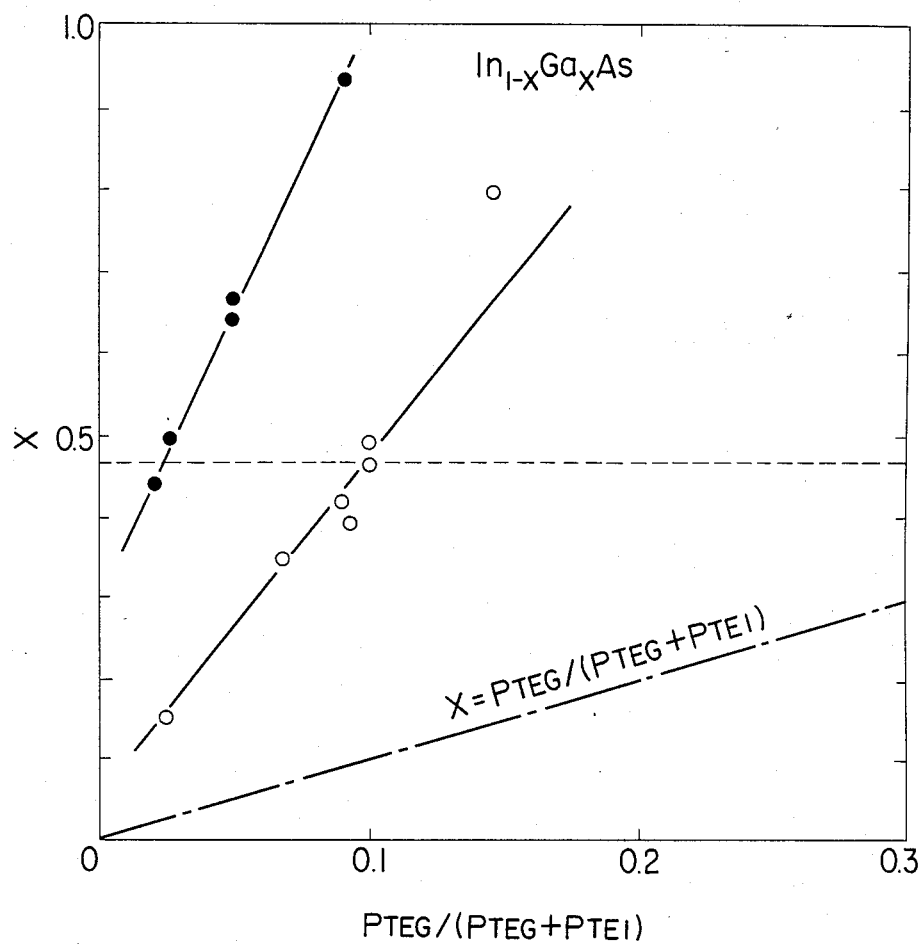
FIG. 4 is a diagram showing the controllability of the composition x in an epitaxial growth of $In_{1-x}Ga_xAs$ in the vapor phase epitaxial growth apparatus of FIG. 3.

The growth under atmospheric pressure has generally been considered to be difficult to control the composition. The present invention has however made it possible to form with ease $In_{0.53}Ga_{0.47}As$ which is lattice-matched with InP. It was ascertained by Hall measurement that a carrier concentration of $4.7 \times 10^{16}$ cm$^{-3}$ and a mobility of 3050 cm²/V.sec. were achieved. FIG. 4 shows diagrammatically the relationship between composition x and the pressure of TEG as a source material. Solid dots indicate results of a conventional growth process whereas circles represent results of the example according to this invention. It is readily envisaged that, owing to the thermal decomposition of AsH₃ in the tube 17, the present invention involves less danger of forming a complex of TEI and AsH₃ and In is thus incorporated efficiently.

Figure 5:
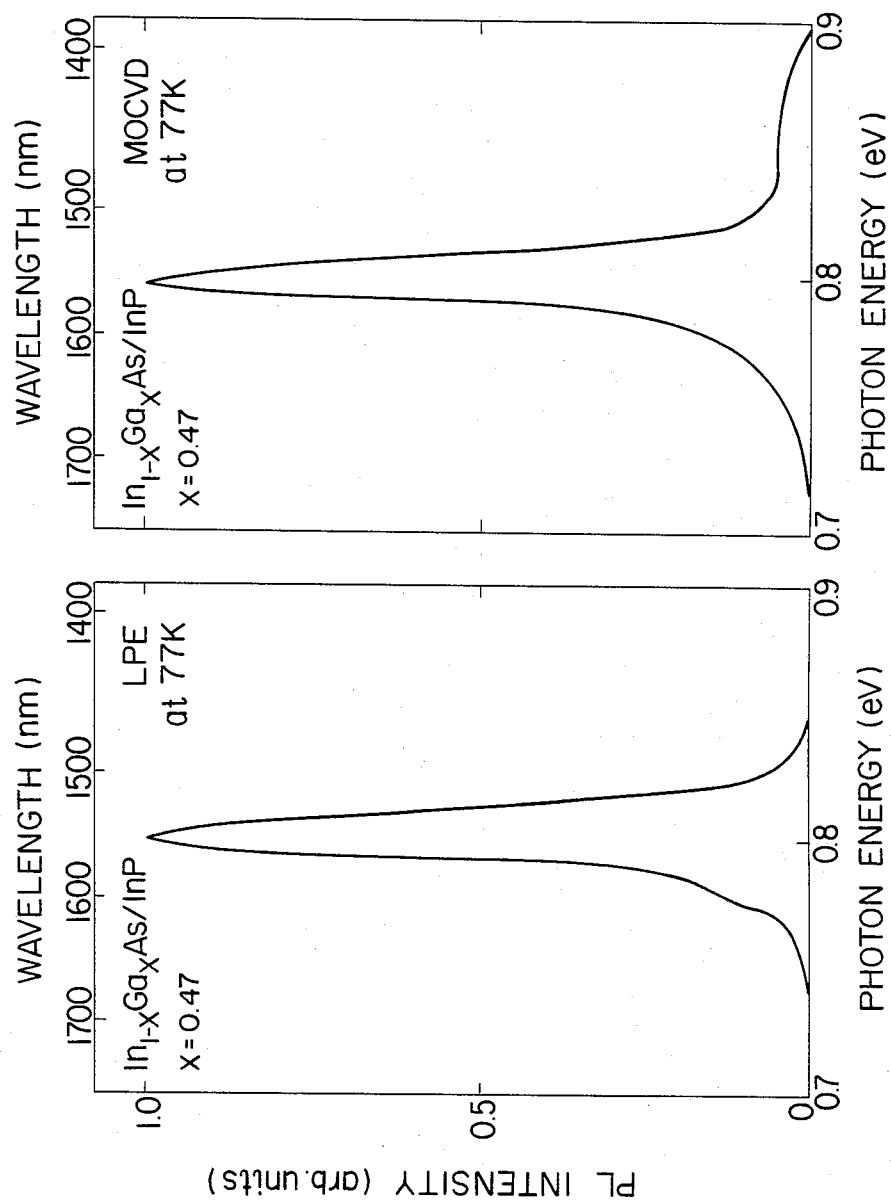
FIG. 5 illustrates the characteristics of photoluminescence at 77K of an $In_{0.53}Ga_{0.47}As$ layer produced in the apparatus of FIG. 3, in comparison with the characteristics of photoluminescence at 77K of an LPE-grown film.

The photoluminescence of the thus-formed $In_{0.53}Ga_{0.46}As$ layer is diagrammatically illustrated in FIG. 5. The layer showed a sharp spectrum similar to that of an $In_{0.53}Ga_{0.47}As$ layer grown by the liquid phase epitaxy (LPE) process which is generally considered to give grown layers having good crystallinity. Tha half width of the former $In_{0.53}Ga_{0.46}As$ layer was 19 meV which has never been achieved to date.

Figure 6:
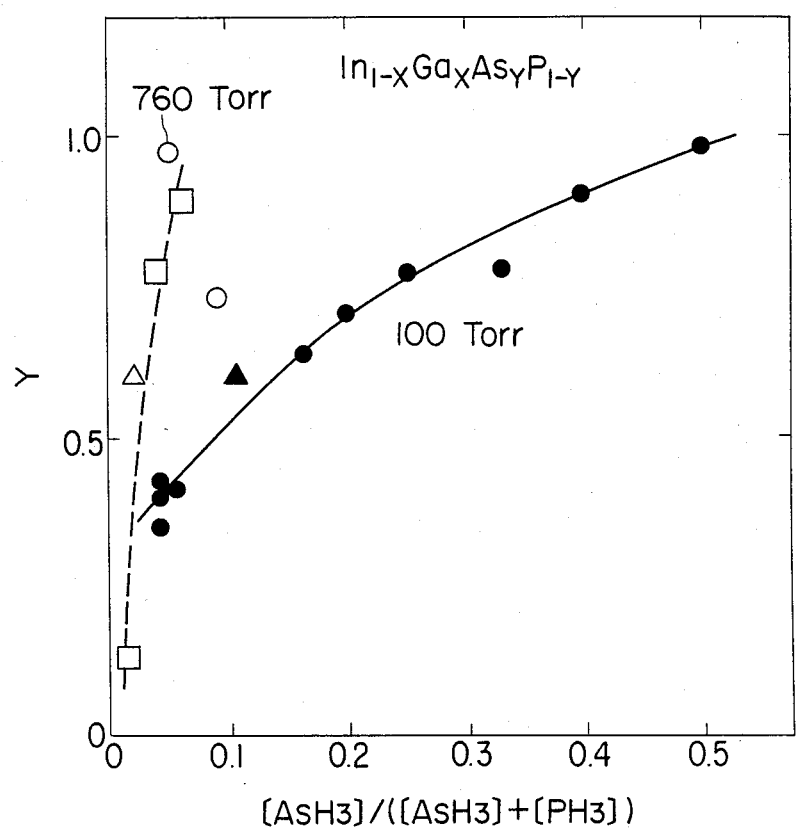
FIG. 6 is a diagram showing the controllability of the composition in $In_{1-x}Ga_xAs_yP_{1-y}$ produced in the apparatus of FIG. 3.

FIG. 6 illustrates diagrammatically the relationship between the composition y and the mole ratio of fed AsH₃ gas, as an example of composition control of an $IN_{1-x}Ga_xAs_yP_{1-y}$ quaternary alloy produced in the invention apparatus of FIG. 3. Data obtained in accordance with the process of this invention in this example are indicated by circles (at atmospheric pressure of 760 Torr) and solid dots (at a reduced pressure of 100 Torr). For the same of comparison, data obtained by effecting an epitaxial growth under reduced pressure without using the pre-decomposing device in FIG. 1 are indicated by squares. On the other hand, data reported as results of epitaxial growth conducted under reduced pressure in the conventional apparatus of FIG. 1 are respectively indicated by triangles and solid triangles. The present invention can bring about substantially the same results even under atmospheric pessure as those available from conducting the conventional process under reduced pressure. As apparent from FIG. 6, it has coventionally been difficult to control the proportion y and the efficiency of incorporation of, especially, P has heretofore been poor. When the present invention is applied under reduced pressure, the efficiency of incorporation of P is improved and the composition control of crystals is thus facilitated, thereby making it possible to obtain desired crystals with a high level of accuracy.

Figure 7:
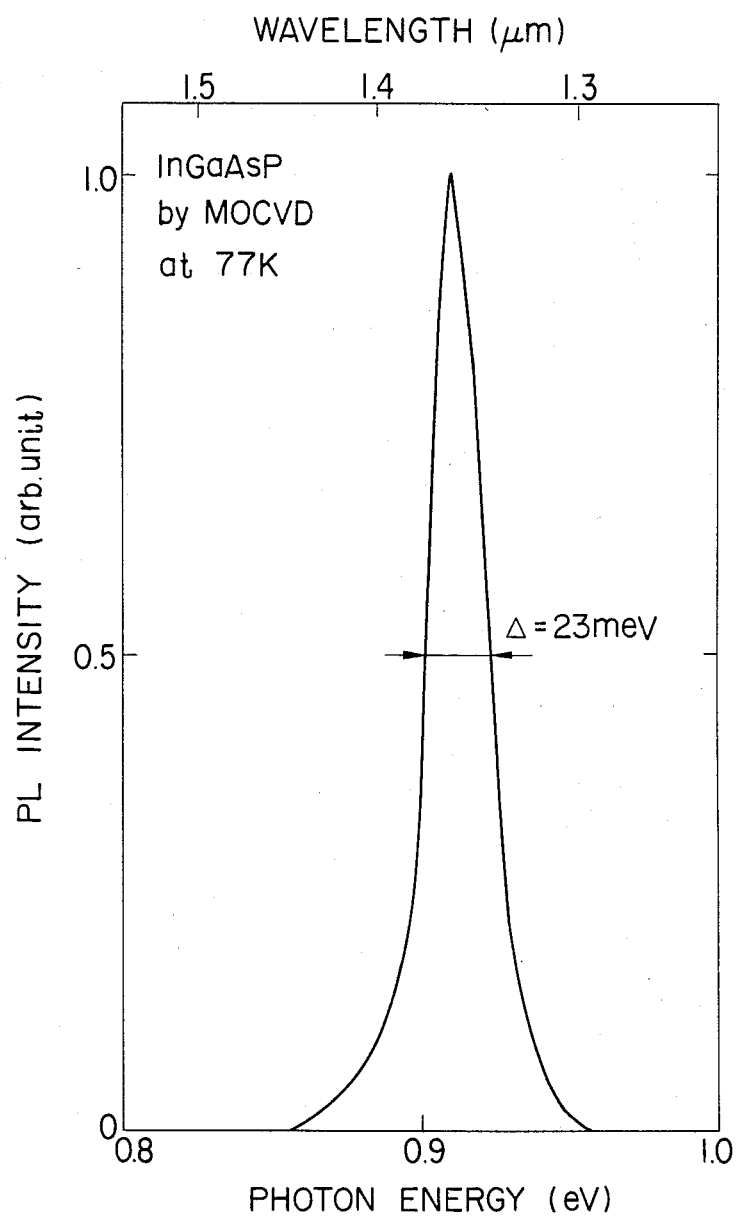
FIG. 7 is a characteristic diagram of photoluminescence at 77K of InGaAsP produced in the apparatus of FIG. 3.

FIG. 7 diagrammatically illustrates the photoluminescence at 77K of an InGaAsP quaternary alloy formed under growth conditions given in Table 3 in the apparatus of FIG. 3.

TABLE 3

| Typical Growth Conditions for InGaAsP | |
|---|---|
| Growth temperature | 650° C. |
| Flow rates: | |
| H₂ into TEI (45° C.) | 50 cc/min. |
| H₂ into TEG (0° C.) | 1 cc/min. |
| AsH₃ | 1 cc/min. |
| PH₃ | 8 cc/min. |

Crystals prepared under the above conditions had a half value of 23 meV, carrier concentration of $8 \times 10^{16}$ cm$^{-3}$, and mobility of 4200 cm²/V.sec. at room temperature and 5400 cm²/V.sec. at 77K or so. Thus, the quality of the quaternary epitaxial alloy was good.

In FIGS. 2 and 3 which illustrate the apparatus according to this invention respectively, the tube 17 may be extended into the reactor tube from the side of the end cap 14 to the susceptor 13 or heater block 19 and may then be bent backward to the side of the end cap 14 so as to form a gaseous mixture with a gas from the tube 15 at the side of the end cap 14 as in the apparatus of FIG. 2 or 3. Here, the tube 17 may be formed into various shapes including a U-shape or a tortuous shape.

The gaseous mixture is effectively supplied onto the substrate in the invention apparatus of FIG. 3 because it employs the gas-introducing member 25 and gas-feeding tube 15. When forming for example an $In_{0.73}Ga_{0.27}As_{0.59}P_{0.41}$ quaternary alloy, it has been found that the absolute feed amount of the gaseous mixture may be reduced to 1/5–1/10 of that required in conventional epitaxial growth processes when the present invention is applied at a reduced pressure of 100 Torr. Thus, the superiority of the present invention has been ascertained from the viewpoint of product costs.

FIG. 8 is a schematic illustration of an apparatus used in Example 3 of the present invention. The apparatus in this Example is suited for mass production and uses an InP substrate of 2 inches across. It is desired to form the epitaxial growth chamber 1 into a rectangle so that a stagnant layer and stream layer are formed satisfactorily with high efficiency. (Needless to say, the epitaxial growth chamber may also be formed into a cylinder.) The PH₃ gas and AsH₃ gases are fed through a gas-feeding tube 27. While passing through a pre-decomposition region 28, these gases are thermally decomposed. On the other hand, TEI,TEG and the like are fed through the gas-feeding tube 15. These gases are mixed together at a point adjacent to a region 29. A gas-introducing member 25 similar to that employed in FIG. 2 may also be provided in order to carry out the mixing efficiently. The stagnant layer and stream layer are formed by the stream of the thus-formed gaseous mixture, whereby to form InP or the like on substrates 26. In FIG. 8, the pre-decomposition region 28 which is adapted to thermally decompose PH₃, AsH₃ and the like that require pre-decomposition is formed in an upper part of the epitaxial growth chamber 1. The pre-decomposition region 28 may be formed in a lower part of the epitaxial growth chamber 1 as depicted in FIG. 9. When the pre-decomposition region 28 is arranged as in FIG. 9, it is possible to form cold walls by forming forced cooling zones 30 in the upper wall and side walls of the epitaxial growth chamber 1. The forced cooling zones 30 can avoid the reevaporation of deposited substances and can thus reduce the contamination of each grown layer further.

Figure 10:
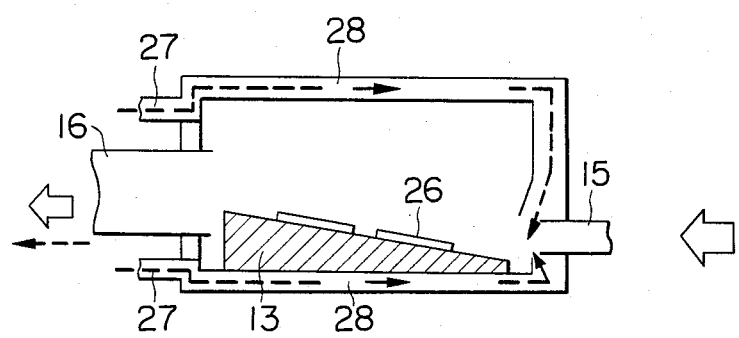

The pre-decomposition region 28 are formed in the upper or lower wall of the epitaxial growth chamber 1 in FIG. 8 or 9. It may alternatively be formed in a side wall of the epitaxial growth chamber 1. As a further alternative structure, the epitaxial growth chamber 1 may be formed into a double-walled box as illustrated in FIG. 10 and the inter-wall spacing may be used as the pre-decomposition region 28.

Figure 11:
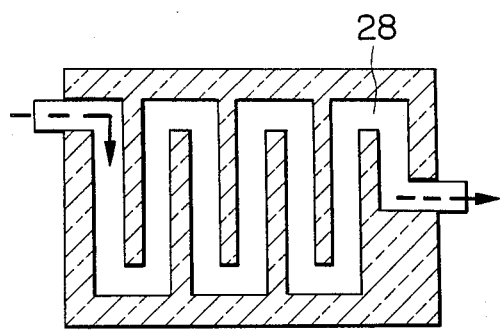
FIG. 11 is a schematic cross-sectional view of a guide member for a second reactant gas, which guide member pertains to a still further embodiment of this invention.

When two pre-decomposition regions are formed respectively in the upper and lower walls of the epitaxial growth chamber 1 respectively as illustrated in FIGS. 8 and 9 and, for example, InGaAsP is caused to grow in the epitaxial growth chamber 1, $PH_3$ which has poor thermal decomposability may be introduced through the lower wall and $AsH_3$ may be fed through the upper wall. In the apparatus of FIGS. 8, 9 or 10, the epitaxial growth chamber 1 in which gases are mixed together does not contain anything which may disturb the flow of each gas. Thus, the apparatus of FIGS. 8, 9 or 10 is more desirous for the growth of crystals. The pre-decomposition region 28 may be formed into a tortuous shape as illustrated in FIG. 11 so as to prolong the actual heating time period of a gas to be introduced into the epitaxial growth chamber 1. In the embodiments of FIGS. 8 through 10, the pre-decomposition region 28 and the epitaxial growth chamber 1 are formed as an integral unit. They may however be provided as separate members.

A growth of InP was carried out under the conditions given in Table 4 in such an epitaxial growth chamber as shown in FIG. 8.

TABLE 4

| Typical Growth Conditions for InP | |
|---|---|
| Growth Temperature | 650° C. |
| Flow rates: | |
| $H_2$ into TEI (45° C.) | 150 cc/min. |
| $PH_3$ | 4 cc/min. |
| Total flow | 6 l/min. |
| Pressure | 100 Torr |

As a result, an InP film was formed to a thickness of 1 μm + 0.1 μm, namely with good in-plane uniformity on the substrate 26 having a diameter of 2 inches. The InP film was a good epitaxial layer having a carrier concentration of $1 \times 10^{16}$ cm$^{-3}$ and a mobility of 3500 cm$^2$/V.sec. For mass production, it is more effective to use the apparatus shown respectively in FIGS. 8 to 10.

In the above-described Examples, high-frequency heating method was applied as the heating method. Other heating methods, namely, the lamp heating method, resistive heating method and the like may also be applied. Furthermore, the shape of the chamber is not necessarily limited to a horizontal type. The present invention may also be carried out in a vertical epitaxial growth chamber. In addition, the shape of the epitaxial growth chamber may be of any shape, for example, may be cylindrical or rectangular.

The above Examples have been described with reference to the vapor phase growth of InP-base compound semiconductors such as InP, InGaAs and InGaAsP. The present inventin may however be applied to processes having reaction steps similar to the InP-base compound semiconductors, for example, to the epitaxial growth of layers of other compound semiconductors which contain P(phosporus) such as InGaP, AlInP, InGaAlP, InAlAs, InAlAsP, AlAsP and InAsP, the epitaxial growth of systems containing indium alkyls and the growth of compound semiconductors making use of other gases having poor thermal decomposability.

As has been described, the present invention is able to form an epitaxially grown layer having good quality effectively at a relatively fast velocity by means of an apparatus having a simple structure while minimizing the deposition of undesired substances. The present invention is suitable for the mass production of grown layers of III–V or II–VI base compound semiconductors. The present invention has a high value from the industrial viewpoint.

What is claimed is:

1. A metal-organic chemical vapor deposition process for forming a compound semiconductor, comprising the steps of:
    disposing a substrate in a deposition chamber;
    introducing a first reactant gas comprising a metal organic compound into said chamber, so that said gas flows from an upstream region toward a downstream region within the chamber;
    providing a heated guide tube having a wall extending between said regions in said chamber;
    feeding a thermally decomposable second reactant gas through said guide tube from said downstream region to said upstream region, while heating at least a portion of the wall of the guide tube to a temperature sufficient to at least partially pre-decompose said second reactant gas and reduce deposition of at least one decomposition product of said second reactant gas on the inner surface of said guide tube;
    mixing said first and second reactant gases in said upstream region; and
    supplying the resulting mixture of said gases to a surface of said substrate, so that a layer comprising said compound semiconductor is formed on said surface.

2. The process according to claim 1, comprising the additional steps of disposing said substrate in thermal contact with a heated susceptor disposed between said upstream and downstream regions.

3. The process according to claim 2, wherein a first portion of the outer surface of said guide tube is disposed in thermal contact with said susceptor.

4. The process according to claim 3, comprising the additional step of providing a heater block in thermal contact with a second portion of the outer surface of said guide tube between said downstream region and said first portion of the outer surface of said guide tube.

5. The process according to claim 4, comprising the additional step of heating said susceptor and said heater block by radio frequency induction means disposed outside said chamber.

6. The process according to claim 5, wherein said heater block comprises an auxiliary susceptor, and said radio frequency induction means includes an auxiliary radio frequency coil for heating said auxiliary susceptor.

7. A process as claimed in claim 1, wherein the first reactant gas contains an indium alkyl compound.

8. A process as claimed in claim 1, wherein the guide tube has a U-shaped or tortuous structure.

9. A process as claimed in claim 1, wherein the chamber and guide tube are heated by high-frequency waves or light radiation.

10. A process as claimed in claim 1, wherein the chamber is rectangular in cross-section.

11. A process as claimed in claim 1, wherein a gas-introducing member is provided in the vicinity of the substrate disposed in the chamber so that the gaseous mixture of the first and second reactant gases is formed in the gas-introducing member.

12. A process as claimed in claim 1, wherein the interior of the chamber is kept under a reduced pressure.

13. A process as claimed in claim 1, wherein the guide tube is heated simultaneously with the substrate by means of an epitaxial growth heater.

14. A process as claimed in claim 1, wherein the compound semiconductor contains In.

15. A process as claimed in claim 14, wherein the compound semiconductor contains at least one compound selected from the group consisting of InP, InGaAsP, InGaAs, InGaAlP, InAlP and InGaP.

16. A process as claimed in claim 1, wherein the second reactant gas, which flows through the guide member, is a reactant gas having poor thermal decomposability.

17. A process as claimed in claim 16, wherein the second reactant gas flowing through the guide member contains a phosphorus compound.

18. A process as claimed in claim 1, wherein the chamber and guide tube are formed into an integral structure.

19. A process as claimed in claim 18, wherein the guide member is provided in the upper, lower or side wall of the chamber.

20. A metal-organic chemical vapor deposition process of vapor phase epitaxy for forming a compound semiconductor, which process comprises disposing a substrate in an epitaxial growth chamber, feeding a thermally decomposable second reactant gas through a heated guide member extending from the downstream side to the upstream side of the flow of a first reactant gas which contains an indium alkyl compound, at least a portion of the guide member being heated to a temperature sufficient to reduce deposition of a decomposition product of said second reactant gas on an inner surface portion of said guide member, mixing the first reactant gas fed from the upstream side with the second reactant gas fed through the guide member, and supplying the resultant gaseous mixture of the first and second reactant gases onto the substrate so as to form the compound semiconductor in the form of a layer.

21. A metal-organic chemical vapor deposition process of vapor phase epitaxy for forming a compound semiconductor, which process comprises disposing a substrate in an epitaxial growth chamber, feeding a thermally decomposable second reactant gas through a heated guide member extending from the downstream side to the upstream side of the flow of a first reactant gas which contains a phosphorus compound, at least a portion of the guide member being heated to a temperature sufficient to reduce deposition of a decomposition product of said second reactant gas on an inner surface portion of said guide member, mixing the first reactant gas fed from the upstream side with the second reactant gas fed through the guide member, and supplying the resultant gaseous mixture of the first and second reactant gases onto the substrate so as to form the compound semiconductor in the form of a layer.

22. A metal-organic chemical vapor deposition process of vapor phase epitaxy for forming a compound semiconductor, which process comprises disposing a substrate in an epitaxial growth chamber the interior of which is kept under a reduced pressure, feeding a thermally decomposable second reactant gas through a heated guide member extending from the downstream side to the upstream side of the flow of a first reactant gas comprising a metal-organic compound, mixing the first reactant gas fed from the upstream side with the second reactant gas fed through the guide member, and supplying the resultant gaseous mixture of the first and second reactant gases onto the substrate so as to form the compound semiconductor in the form of a layer.

* * * * *